United States Patent
Hwang

(10) Patent No.: US 9,590,625 B2
(45) Date of Patent: Mar. 7, 2017

(54) INTERFACE CIRCUIT INCLUDING BUFFER CIRCUIT FOR HIGH SPEED COMMUNICATION, SEMICONDUCTOR APPARATUS AND SYSTEM INCLUDING THE SAME

(71) Applicant: SK hynix Inc., Icheon-si, Gyeonggi-do (KR)

(72) Inventor: Kyu Dong Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/742,922

(22) Filed: Jun. 18, 2015

(65) Prior Publication Data

US 2016/0254814 A1    Sep. 1, 2016

(30) Foreign Application Priority Data

Feb. 27, 2015 (KR) .................. 10-2015-0028311

(51) Int. Cl.
*H03L 5/00* (2006.01)
*H03K 19/00* (2006.01)
*H03K 19/0185* (2006.01)

(52) U.S. Cl.
CPC . *H03K 19/0013* (2013.01); *H03K 19/018507* (2013.01)

(58) Field of Classification Search
None
See application file for complete search history.

(56) References Cited

U.S. PATENT DOCUMENTS

| | | | |
|---|---|---|---|
| 7,193,468 B2 | 3/2007 | Kwon et al. | |
| 7,459,938 B2 * | 12/2008 | To | G06F 13/4086 326/30 |
| 8,200,179 B1 | 6/2012 | Mosinskis et al. | |
| 8,922,276 B2 * | 12/2014 | Iwamoto | H03F 3/45179 330/9 |
| 2009/0153192 A1 * | 6/2009 | Aranovsky | H03K 19/018521 326/83 |
| 2010/0253440 A1 * | 10/2010 | Li | H03K 3/0315 331/57 |
| 2011/0169556 A1 * | 7/2011 | Kimura | G11C 19/184 327/534 |
| 2012/0001663 A1 * | 1/2012 | Willey | H03K 19/018514 327/109 |
| 2015/0187335 A1 * | 7/2015 | Sugiyama | G09G 3/32 345/208 |
| 2016/0149575 A1 * | 5/2016 | Hwang | H03K 19/00384 327/108 |

FOREIGN PATENT DOCUMENTS

KR    1020090047619 A    5/2009

* cited by examiner

*Primary Examiner* — Lincoln Donovan
*Assistant Examiner* — Khareem E Almo
(74) *Attorney, Agent, or Firm* — William Park & Associates Ltd.

(57) ABSTRACT

A buffer circuit may include an amplification unit and an active load unit. The amplification unit is electrically coupled to an output node and configured to sense and amplify first and second signals. The active load unit is configured to form a peak of a signal outputted from the output node when the signal transitions.

27 Claims, 9 Drawing Sheets

INTERFACE CIRCUIT INCLUDING BUFFER CIRCUIT FOR HIGH SPEED COMMUNICATION, SEMICONDUCTOR APPARATUS AND SYSTEM INCLUDING THE SAME

CROSS-REFERENCES TO RELATED APPLICATION

The present application claims priority under 35 U.S.C. §119(a) to Korean application number 10-2015-0028311, filed on Feb. 27, 2015, in the Korean Intellectual Property Office, which is incorporated herein by reference in its entirety as set forth in full.

BACKGROUND

1. Technical Field

Various embodiments relate to a semiconductor apparatus, and more particularly, to an interface circuit having a buffer circuit for high speed communication and a semiconductor apparatus and a semiconductor system having the same.

2. Related Art

An electronic device such as a personal computer, a tablet PC, a laptop computer, and a smartphone may comprise various electronic elements. The electronic elements in the electronic device perform communications with one another in order to process a great deal of data for a short time. The electronic elements are coupled to one another through buses, and perform communication through interface circuits. One of communication techniques for the electronic elements is the serial communication technique.

As performances of the electronic elements are improved, need for communication techniques capable of widening bandwidth and reducing power consumption increases. To meet the needs, new serial interface communication techniques are variously proposed and the interface circuits for the communication techniques are being improved.

SUMMARY

In an embodiment of the invention, a buffer circuit may include an amplification unit electrically coupled to an output node and configured to sense and amplify first and second signals. The buffer circuit may also include an active load unit configured to form a peak of a signal outputted from the output node when the signal transitions.

In an embodiment of the invention, a buffer circuit may include an amplification unit configured to change voltage levels of a positive output node and a negative output node by sensing and amplifying first and second signals. The buffer circuit may also include a first active load configured to allow the negative output node to be further driven for a predetermined amount of time according to the first signal and a signal outputted from the negative output node when the voltage level of the negative output node transitions. The buffer circuit may also include a second active load configured to allow the positive output node to be further driven for another predetermined amount of time according to a signal outputted from the positive output node.

In an embodiment of the invention, a buffer circuit may include an amplification unit configured to change voltage levels of a positive output node and a negative output node by sensing and amplifying first and second signals. The buffer circuit may also include a first active load configured to allow the negative output node to be further driven for a predetermined amount of time according to the first signal and a signal outputted from the negative output node when the voltage level of the negative output node transitions. The buffer circuit may also include a second active load configured to allow the positive output node to be further driven for another predetermined amount of time according to an inversed signal of the first signal and a signal outputted from the positive output node when the voltage level of the positive output node transitions.

DETAILED DESCRIPTION

Hereinafter, a semiconductor apparatus according to the invention will be described below with reference to the accompanying figures through various embodiments.

Figure 1:
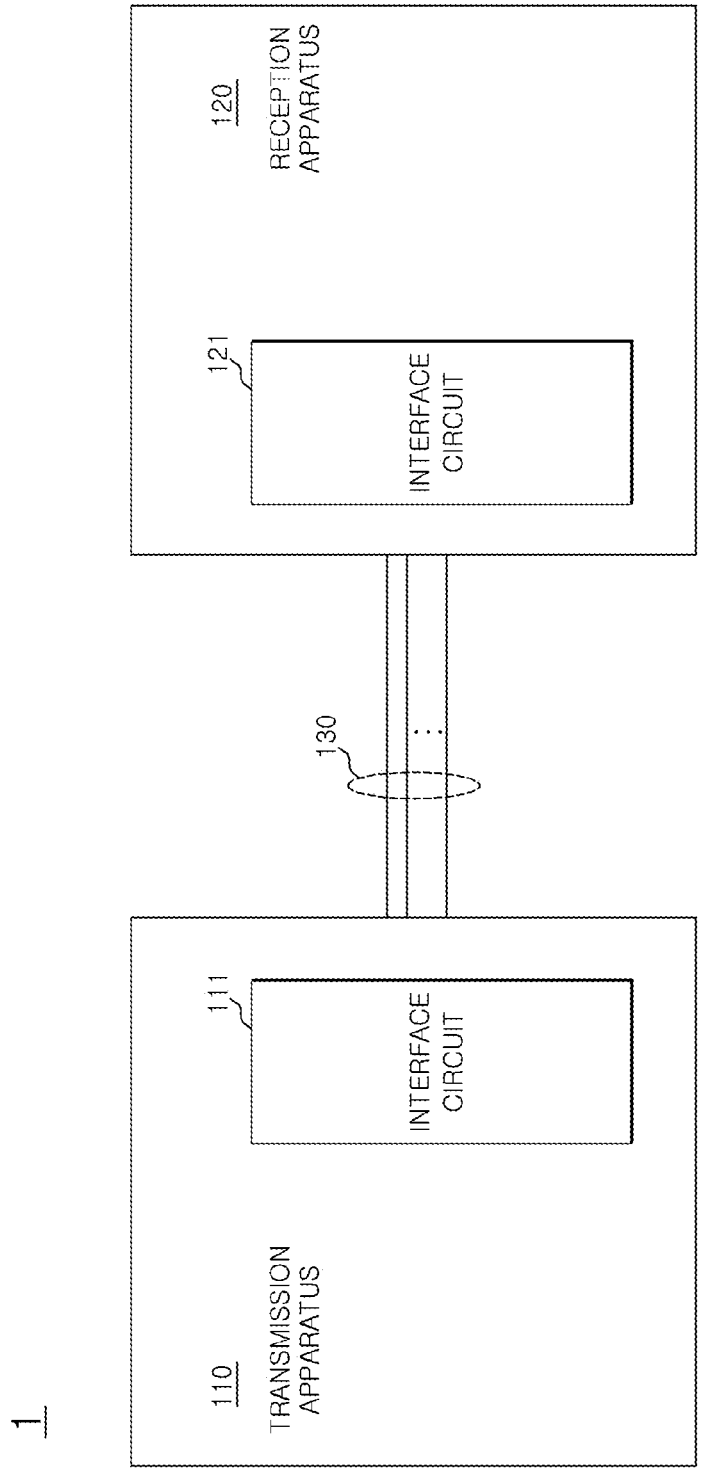
FIG. 1 is a block diagram illustrating a system in accordance with an embodiment of the invention.

Referring to FIG. 1, a system 1 in accordance with an embodiment of the invention may include a transmission apparatus 110 and a reception apparatus 120. The transmission apparatus 110 may represent electronic elements for transmitting data in the system 1. Further, the reception apparatus 120 may represent electronic element for receiving the transmitted data from the transmission apparatus 110 in the system 1. For example, the system 1 may include a master apparatus and a slave apparatus. When data is transmitted from the master apparatus to the slave apparatus, the master apparatus may be the transmission apparatus 110 and the slave apparatus may be the reception apparatus 120. When data is transmitted from the slave apparatus to the master apparatus, the slave apparatus may be the transmission apparatus 110 and the master apparatus may be the reception apparatus 120. The master apparatus may be a host apparatus such as a processor including a central processing unit (CPU), a graphic processing unit (GPU), a multi-media processor (MMP), and a digital signal processor. In addition, the master apparatus may be implemented in the form of a system on chip through combination of processor chips of various functions including an application processor (AP). The slave apparatus may be a memory. The memory may include a volatile memory and a non-volatile memory. The volatile memory may include a static random access memory (SRAM), a dynamic RAM (DRAM), and a synchronous DRAM (SDRAM). The non-volatile memory may include a read only memory (ROM), a programmable ROM (PROM), an erasable PROM (EPROM), an electrically erasable and programmable ROM (EEPROM), a flash memory, a phase change RAM (PRAM), a magnetic RAM (MRAM), resistive RAM (RRAM), and a ferroelectric RAM (FRAM).

The transmission apparatus 110 and the reception apparatus 120 may be electrically coupled to each other through a plurality of signal transmission lines 130 to form a link. The transmission apparatus 110 and the reception apparatus 120 may perform communication to each other by transmitting and receiving a control signal and data through the plurality of signal transmission lines 130. The transmission apparatus 110 and the reception apparatus 120 may include interface circuits 111 and 121, respectively. The interface circuits 111 and 121 may be physical layers for the communication between the transmission apparatus 110 and the reception apparatus 120. The interface circuit 111 of the transmission apparatus 110 may include a transmission driver for transmission of a signal through the plurality of signal transmission lines 130. The transmission driver may include a plurality of transmitters for driving the plurality of signal transmission lines 130. The interface circuit 121 of the reception apparatus 120 may include a reception driver for reception of a signal through the plurality of signal transmission lines 130. The reception driver may include a plurality of receivers electrically coupled to the plurality of signal transmission lines 130.

Figure 2:
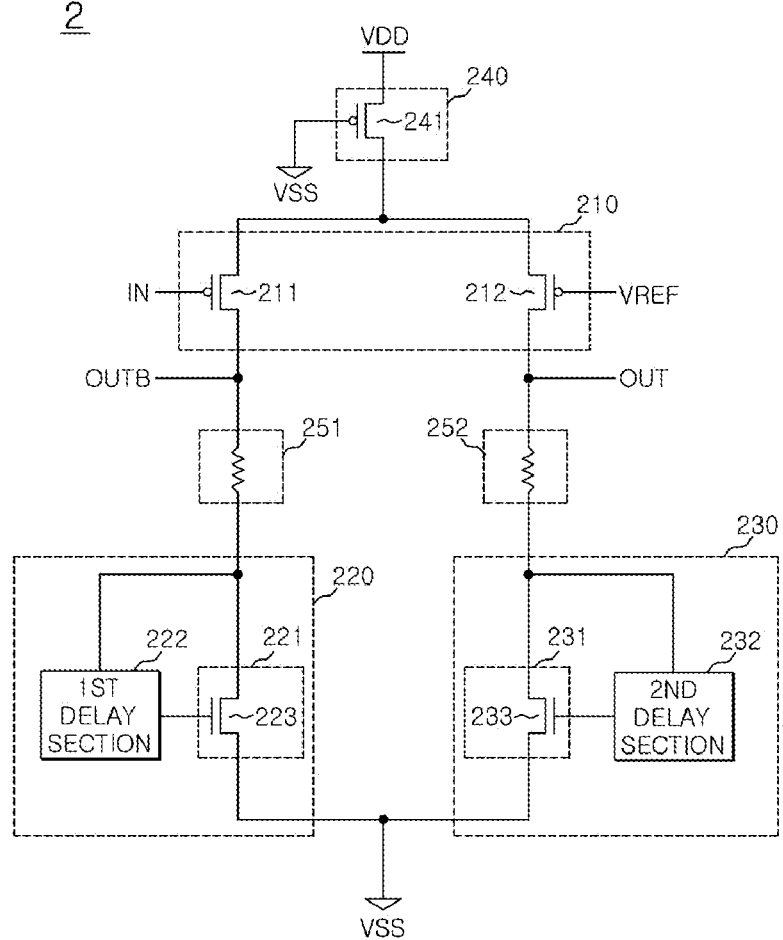
FIG. 2 is a circuit diagram illustrating a buffer circuit in accordance with an embodiment of the invention.

Referring to FIG. 2, a circuit diagram illustrating a buffer circuit 2 in accordance with an embodiment of the invention is described. The buffer circuit 2 shown in FIG. 2 may be applied to a receiver of the interface circuit 121 of the reception apparatus 120. In FIG. 2, the buffer circuit 2 may include an amplification unit 210, a first active load 220 and a second active load 230. The amplification unit 210 may receive a first signal IN and a second signal VREF. The amplification unit 210 may be electrically coupled to output nodes. The amplification unit 210 may generate an output signal by sensing and amplifying the first and second signals IN and VREF. The output nodes may include a positive output node OUT and a negative output node OUTB. The amplification unit 210 may output the output signal through the positive output node OUT and may output a differential signal of the output signal through the negative output node OUTB. In an embodiment, the first signal IN may have a level changing in between first and second voltages. Further, the second signal VREF may be a reference voltage. The reference voltage may have a level in between the first and second voltages. For example, the reference voltage may have an average level of the first and second voltages. In an embodiment, the second signal VREF may be a differential signal of the first signal IN. The first signal IN may be a power voltage (VDD) that the buffer circuit 2 receives. In addition, the second signal VREF may be a ground voltage (VSS).

The first active load 220 may be electrically coupled between the negative output node OUTB and a second voltage node. When a voltage level of the differential signal outputted from the negative output node OUTB are changing, the first active load 220 may allow the negative output node OUTB to be additionally driven on the basis of the differential signal of the output signal outputted from the negative output node OUTB. When the voltage level of the differential signal outputted from the negative output node OUTB are changing, the first active load 220 may allow the negative output node OUTB to be additionally driven for a predetermined amount of time. Therefore, when the voltage level of the differential signal outputted from the negative output node OUTB are changing, the first active load 220 may generate a peak of the differential signal of the output signal outputted from the negative output node OUTB.

The second active load 230 may be electrically coupled between the positive output node OUT and the second voltage node. When a voltage level of the output signal outputted from the positive output node OUT are changing, the second active load 230 may allow the positive output node OUT to be additionally driven on the basis of the output signal outputted from the positive output node OUT. When the voltage level of the output signal outputted from the positive output node OUT are changing, the second active load 230 may allow the positive output node OUT to be additionally driven for a predetermined amount of time. Therefore, when the voltage level of the output signal outputted from the positive output node OUT are changing, the second active load 230 may generate a peak of the output signal outputted from the positive output node OUT.

In FIG. 2, the first active load 220 may include a first current sink section 221 and a first delay section 222. The first current sink section 221 may form a current path based on the differential signal of the output signal outputted from the negative output node OUTB. For example, the first current sink section 221 may form the current path when the differential signal of the output signal outputted from the negative output node OUTB has a high level. The first current sink section 221 may block the current path when the differential signal of the output signal outputted from the negative output node OUTB has a low level. The first current sink section 221 may electrically couple the negative output node OUTB to the second voltage node when the differential signal of the output signal outputted from the negative output node OUTB has the high level. The first current sink section 221 may decouple the negative output node OUTB from the second voltage node when the differential signal of the output signal outputted from the negative output node OUTB has the low level. The first delay section 222 may delay an operation of the first current sink section 221 for a predetermined amount of time when the voltage level of the negative output node OUTB transitions. For example, when the voltage level of the negative output node OUTB transitions from the high level to the low level, the first current sink section 221 may block the current path which is currently formed. At this time, the first delay section 222 may delay the differential signal of the output signal outputted from the negative output node OUTB for a predetermined amount of time for the differential signal to be inputted to the first current sink section 221, and thus may delay an operational time point of the first current sink section 221. Therefore, the first current sink section 221 may keep the currently formed current path for the predetermined amount of time even though the voltage level of the negative output node OUTB transitions to the low level. After the delay for the predetermined amount of time, the first current sink section 221 may block the current path.

The second active load 230 may include a second current sink section 231 and a second delay section 232. The second current sink section 231 may form a current path based on the output signal outputted from the positive output node OUT. For example, the second current sink section 231 may form the current path when the output signal outputted from the positive output node OUT has a high level. The second current sink section 231 may block the current path when the output signal outputted from the positive output node OUT has a low level. The second current sink section 231 may electrically couple the positive output node OUT to the second voltage node when the output signal outputted from the positive output node OUT has the high level. The second current sink section 231 may decouple the positive output node OUT from the second voltage node when the output signal outputted from the positive output node OUT has the low level. The second delay section 232 may delay an operation of the second current sink section 231 for a predetermined amount of time when the voltage level of the positive output node OUT transitions.

The buffer circuit 2 may further include an enablement unit 240. The enablement unit 240 may be electrically coupled between the first voltage node and the amplification unit 210. The enablement unit 240 may form a current path between the first voltage node and the amplification unit 210. The enablement unit 240 may form the current path based on the second voltage.

The amplification unit 210 may include first and second transistors 211 and 212. The first and second transistors 211 and 212 may be P-channel MOS transistors. The first transistor 211 may receive the first signal IN at its gate, may receive the first voltage at its source through the enablement unit 240, and may be electrically coupled to the negative output node OUTB at its drain. The second transistor 212 may receive the second signal VREF at its gate, may receive the first voltage at its source through the enablement unit 240, and may be electrically coupled to the positive output node OUT at its drain. When the voltage level of the first signal IN is lower than the voltage level of the second signal VREF, the amplification unit 210 may output the differential signal of the output signal, which has the high level, through the negative output node OUTB and the output signal, which has the low level, through the positive output node OUT. When the voltage level of the first signal IN is higher than the voltage level of the second signal VREF, the amplification unit 210 may output the differential signal of the output signal, which has the low level, through the negative output node OUTB and the output signal, which has the high level, through the positive output node OUT.

The enablement unit 240 may include a third transistor 241. The third transistor 241 may be the P-channel MOS transistor. The third transistor 241 may receive the second voltage at its gate. The third transistor 241 may also receive the first voltage at its source, and may be electrically coupled to sources of the first and second transistors 211 and 212 included in the amplification unit 210.

The first current sink section 221 may include a fourth transistor 223. The fourth transistor 223 may be the N-channel MOS transistor. The fourth transistor 223 may receive an output of the first delay section 222 at its gate. The fourth transistor 223 may be electrically coupled to the negative output node OUTB at its drain and to the second voltage node at its source. The second current sink section 231 may include a fifth transistor 233. The fifth transistor 233 may be the N-channel MOS transistor. The fifth transistor 233 may receive an output of the second delay section 232 at its gate. The fifth transistor 233 may be electrically coupled to the positive output node OUT at its drain and to the second voltage node at its source.

In FIG. 2, the buffer circuit 2 may further include first and second passive loads 251 and 252. The first and second passive loads 251 and 252 may be electrically coupled between the negative output node OUTB and the first active load 220 and between the positive output node OUT and the second active load 230, respectively. The first passive load 251 may be electrically coupled between the negative output node OUTB and the first active load 220. The second passive load 252 may be electrically coupled between the positive output node OUT and the second active load 230. The first and second passive loads 251 and 252 may include resistive elements, respectively.

Figure 3:
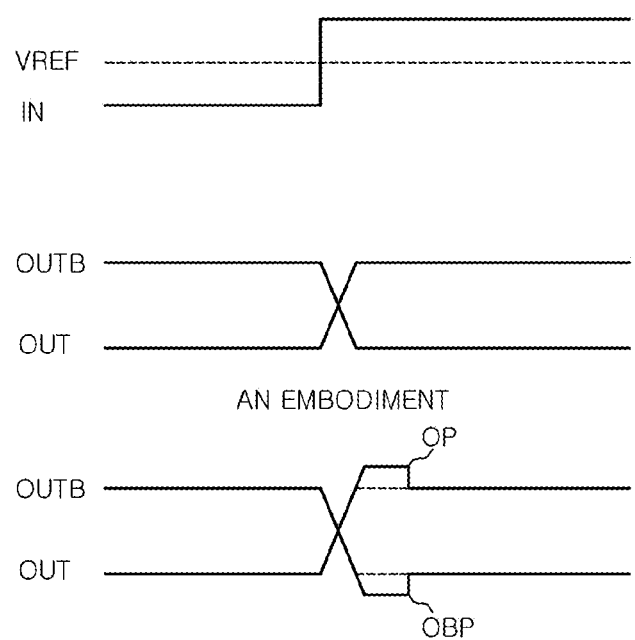
FIG. 3 is a timing diagram illustrating an operation of a buffer circuit shown in FIG. 2.

Referring to FIG. 3, a timing diagram illustrating an operation of a buffer circuit 2 shown in FIG. 2 is illustrated. FIG. 3 illustrates waveforms of the output signal and the differential signal of the output signal, which are respectively outputted from the positive output node OUT and the negative output node OUTB, when the first signal IN transitions from the low level to the high level. When the first signal IN has the low level, the output signal outputted from the positive output node OUT may have the low level and the differential signal of the output signal outputted from the negative output node OUTB may have the high level. In an case unlike that in the invention, when the first signal IN transitions to the high level, the output signal outputted from the positive output node OUT may have the high level and the differential signal of the output signal outputted from the negative output node OUTB may have the low level. However, when the buffer circuit 2 is an element of a semiconductor apparatus operating with high speed and low power voltage, the voltage level difference between the first signal IN and the second signal VREF may be very small. In addition, when the buffer circuit 2 is an element of a semiconductor apparatus using the multi-phase signal transmission, a voltage level change of the first signal IN may be very small. Therefore, it is preferable for the buffer circuit 2 to detect minute change of a voltage level in order to correctly receive a signal.

In accordance with an embodiment of the invention, the buffer circuit 2 may generate peaks of the output signal and the differential signal of the output signal outputted from the positive output node OUT and the negative output node OUTB when the level of the first signal IN transitions. When the first signal IN transitions from the low level to the high level, the first transistor 211 may be turned off. Accordingly, an amount of the current flowing through the negative output node OUTB may become small and an amount of the current flowing through the positive output node OUT may become relatively great. Therefore, the voltage level of the negative output node OUTB may be relatively lower than the voltage level of the positive output node OUT. Thus, the level of the differential signal of the output signal outputted from the negative output node OUTB may transition from the high level to the low level, and the level of the output signal outputted from the positive output node OUT may transition from the low level to the high level.

As the amount of the current flowing through the negative output node OUTB becomes small, the fourth transistor 223 may be turned off. At this time, the first delay section 222 may allow the negative output node OUTB to be further driven to have the low level by the second voltage by delaying the turn-off of the fourth transistor 223 for a predetermined amount of time. Therefore, the peak OBP of the differential signal outputted from the negative output node OUTB may be formed.

Conversely, as the amount of the current flowing through the positive output node OUT becomes great, the fifth transistor 233 may be turned on. At this time, the second delay section 232 may block flowing-out of the current, which flows through the positive output node OUT, to the second voltage node by delaying the turn-on of the fifth transistor 223 for a predetermined amount of time. Due to the continuous current flow from the first voltage node to the positive output node OUT, the positive output node OUT may be further driven to have the level of the first voltage for a predetermined amount of time and therefore the peak OB of the output signal outputted from the positive output node OUT may be formed. When the peak OP of the output signal outputted from the positive output node OUT and the peak OPB of the differential signal of the output signal outputted from the negative output node OUTB are formed, the voltage level difference between the output signal and the differential signal may become greater and thus the buffer circuit 2 may allow the semiconductor apparatus to correctly receive signals.

Figure 4:
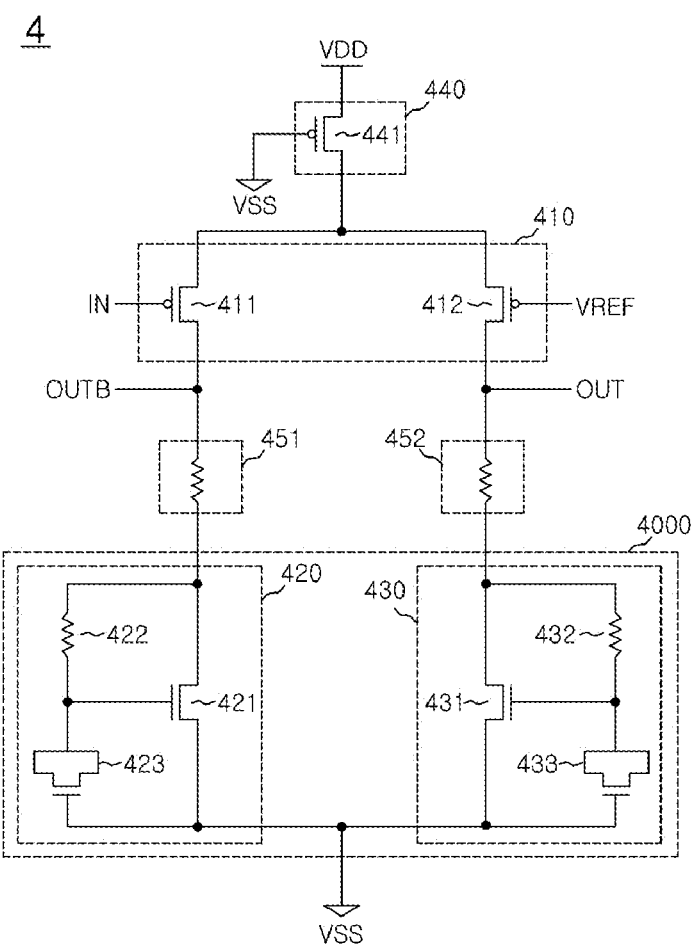
FIG. 4 is a circuit diagram illustrating a buffer circuit in accordance with an embodiment of the invention.

Referring to FIG. 4, a circuit diagram illustrating a buffer circuit 4 in accordance with an embodiment of the invention is illustrated. The buffer circuit 4 shown in FIG. 4 may be applied to a receiver of the interface circuit 121 of the reception apparatus 120. In FIG. 4, the buffer circuit 4 may include an amplification unit 410, and an active load unit 4000. The amplification unit 410 may receive a first signal IN and a second signal VREF. The amplification unit 410 may be electrically coupled to output nodes. The amplification unit 410 may generate an output signal by sensing and amplifying the first and second signals IN and VREF.

The active load unit 4000 may be electrically coupled to the amplification unit 410 through the positive and negative output nodes OUT and OUTB. When the level of signals outputted from the positive and negative output nodes OUT and OUTB are changing, the active load unit 4000 may generate peaks of the signals outputted from the positive and negative output nodes OUT and OUTB. When the levels of the positive and negative output nodes OUT and OUTB are changing, the active load unit 4000 may allow the positive and negative output nodes OUT and OUTB to be additionally driven for a predetermined amount of time. Therefore, when the level of the positive and negative output nodes OUT and OUTB are changing, the active load unit 4000 may generate the peaks of the signals outputted from the positive and negative output nodes OUT and OUTB by allowing the positive and negative output nodes OUT and OUTB to be additionally driven for a predetermined amount of time.

The active load unit 4000 may include a first active load 420 and a second active load 430. The first active load 420 may be electrically coupled between the negative output node OUTB and the second voltage node. When the level of the signal outputted from the negative output node OUTB are changing, the first active load 420 may generate the peak of the signal outputted from the negative output node OUTB. When the level of the negative output node OUTB are changing, the first active load 420 may generate the peak of the signal outputted from the negative output node OUTB by allowing the negative output node OUTB to be additionally driven for the predetermined amount of time. The second active load 430 may be electrically coupled between the positive output node OUT and the second voltage node. The first active load 420 may be electrically coupled between the negative output node OUTB and the second voltage node. When the level of the signal outputted from the positive output node OUT are changing, the second active load 430 may generate the peak of the signal outputted from the positive output node OUT. When the level of the positive output node OUT are changing, the second active load 430 may generate the peak of the signal outputted from the positive output node OUT by allowing the positive output node OUT to be additionally driven for the predetermined amount of time. The first and second active loads 420 and 430 may not comprise an active element such as an inductor but a passive element such as a capacitor and a resistor. Therefore, the first and second active loads 420 and 430 may have characteristics and functions of the active element. The first and second active loads 420 and 430 may also be implemented as a small circuit.

The buffer circuit 4 may further include an enablement unit 440. The enablement unit 440 may be electrically coupled between the first voltage node and the amplification unit 410. The enablement unit 440 may form a current path between the first voltage node and the amplification unit 410. The enablement unit 440 may form the current path based on the second voltage.

In FIG. 4, the amplification unit 410 may include first and second transistors 411 and 412. The first and second transistors 411 and 412 may be P-channel MOS transistors. The first transistor 411 may receive the first signal IN at its gate. The first transistor 411 may also receive the first voltage at its source through the enablement unit 440, and may be electrically coupled to the negative output node OUTB at its drain. The second transistor 412 may receive the second signal VREF at its gate. The second transistor 412 may also receive the first voltage at its source through the enablement unit 440, and may be electrically coupled to the positive output node OUT at its drain. When the voltage level of the first signal IN is lower than the voltage level of the second signal VREF, the amplification unit 410 may output the signal of the high level through the negative output node OUTB and the signal of the low level through the positive output node OUT. When the voltage level of the first signal IN is higher than the voltage level of the second signal VREF, the amplification unit 410 may output the signal of the low level through the negative output node OUTB and the signal of the high level through the positive output node OUT.

The enablement unit 440 may include a third transistor 441. The third transistor 441 may be the P-channel MOS transistor. The third transistor 441 may receive the second voltage at its gate. The third transistor 441 may also receive the first voltage at its source, and may be electrically coupled to sources of the first and second transistors 411 and 412 included in the amplification unit 410.

The first active load 420 may include a fourth transistor 421, a first resistive element 422, and a first capacitive element 423. The fourth transistor 421 may be the N-channel MOS transistor. The fourth transistor 421 may be electrically coupled to the negative output node OUTB at its drain and to the second voltage node at its source. The first resistive element 422 may be electrically coupled between the negative output node OUTB and the fourth transistor 421. The first capacitive element 423 may be electrically coupled between the gate of the fourth transistor 421 and the second voltage node. The predetermined amount of time may be determined by the RC delay of the first resistive element 422 and the first capacitive element 423. For example, when the level of the negative output node OUTB transitions to the high level, the first active load 420 may allow the negative output node OUTB to be further driven to a first voltage level during the RC delay time. Conversely, when the level of the negative output node OUTB transitions to the low level, the first active load 420 may allow the negative output node OUTB to be further driven to a second voltage level during the RC delay time. The fourth transistor 421 may correspond to the first current sink section 221 described with reference to FIG. 2. Further, the first resistive element 422 and the first capacitive element 423 may correspond to the first delay section 222 described with reference to FIG. 2.

The second active load 430 may include a fifth transistor 431, a second resistive element 432, and a second capacitive element 433. The fifth transistor 431 may be the N-channel MOS transistor. The fifth transistor 431 may be electrically coupled to the positive output node OUT at its drain and to the second voltage node at its source. The second resistive element 432 may be electrically coupled between the positive output node OUT and the fifth transistor 431. The second capacitive element 433 may be electrically coupled between the gate of the fifth transistor 431 and the second voltage node. The predetermined amount of time may be determined by the RC delay of the second resistive element 432 and the second capacitive element 433. For example, when the level of the positive output node OUT transitions to the high level, the second active load 430 may allow the positive output node OUT to be further driven to a first voltage level during the RC delay time. Conversely, when the level of the positive output node OUT transitions to the low level, the second active load 430 may allow the positive output node OUT to be further driven to a second voltage level during the RC delay time. The fifth transistor 431 may correspond to the second current sink section 231 described with reference to FIG. 2. In addition, the second resistive element 432 and the second capacitive element 433 may correspond to the second delay section 232 described with reference to FIG. 2.

In FIG. 4, the buffer circuit 4 may further include first and second passive loads 451 and 452. The first and second passive loads 451 and 452 may be electrically coupled between the positive and negative output nodes OUT and OUTB and the active load unit 4000, respectively. The first passive load 451 may be electrically coupled between the negative output node OUTB and the first active load 420. The second passive load 452 may be electrically coupled between the positive output node OUT and the second active load 430. The first and second passive loads 451 and 452 may include resistive elements, respectively.

Figure 5:
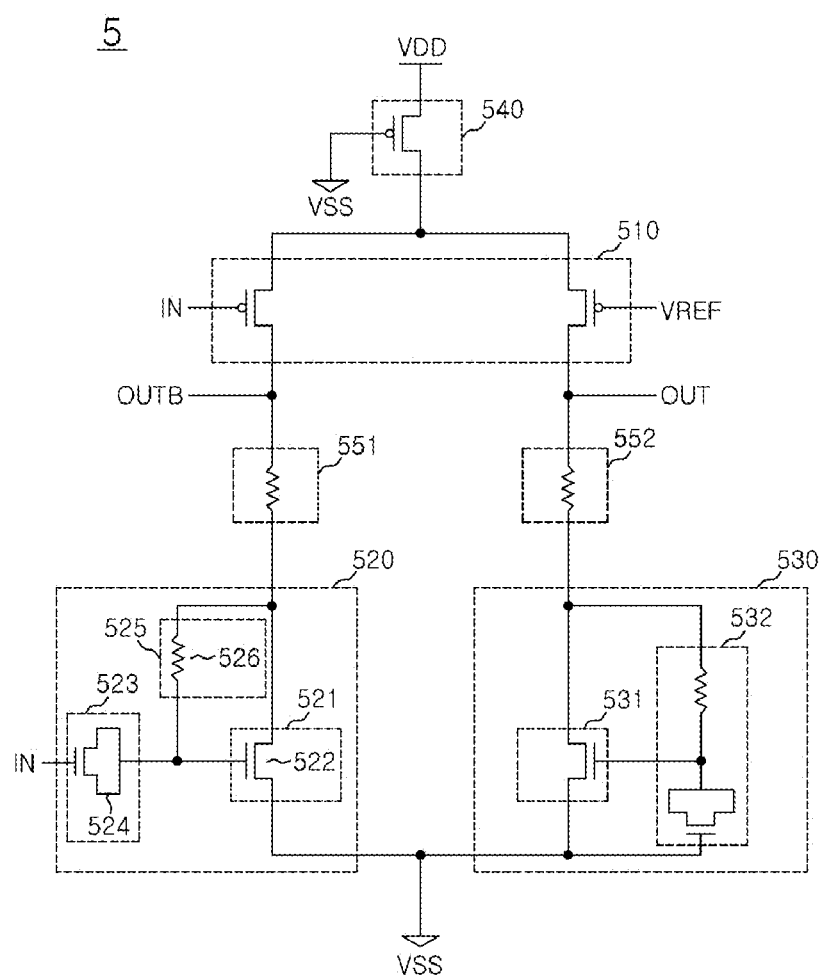
FIG. 5 is a circuit diagram illustrating a buffer circuit in accordance with an embodiment of the invention.

Referring to FIG. 5, a circuit diagram illustrating a buffer circuit 5 in accordance with an embodiment of the invention is shown. In FIG. 5, the buffer circuit 5 may include an amplification unit 510, a first active load 520 and a second active load 530. The buffer circuit 5 may further include an enablement unit 540. The amplification unit 510 and the enablement unit 540 may be the same as the amplification unit 210 and the enablement unit 240 described with reference to FIG. 2, respectively.

The first active load 520 may be electrically coupled between the negative output node OUTB and a second voltage node. The first active load 520 may receive the first signal IN. When a voltage level of a signal outputted from the negative output node OUTB are changing, the first active load 520 may generate a peak of the signal outputted from the negative output node OUTB. When the level of the negative output node OUTB are changing, the first active load 520 may generate the peak of the signal outputted from the negative output node OUTB by allowing the negative output node OUTB to be additionally driven for a predetermined amount of time. Since the first active load 520 forms the peak of the negative output node OUTB by receiving the first signal IN, the first active load 520 may form the peak in more effective way than the first and second active loads 220 and 230 described with reference to FIG. 2. The second active load 530 may be the same as the second active load 230 described with reference to FIG. 2.

In FIG. 5, the first active load 520 may include a first current sink section 521, a first impedance section 523, and a second impedance section 525. The first current sink section 521 may form a current path between the negative output node OUTB and a second voltage node based on the first signal IN and the signal outputted from the negative output node OUTB. For example, the first current sink section 521 may form the current path when the voltage level of the negative output node OUTB is high. The first current sink section 521 may block the current path when the voltage level of the negative output node OUTB is low. The first impedance section 523 may control the first current sink section 521 to form or block the current path. The first impedance section 523 may control the first current sink section 521 based on the first signal IN. For example, the first impedance section 523 may control the first current sink section 521 to form the current path when the first signal IN has a high level. The first impedance section 523 may also control the first current sink section 521 to block the current path when the first signal IN has a low level. The second impedance section 525 may receive the signal outputted from the negative output node OUTB. The second impedance section 525 may delay the signal outputted from the negative output node OUTB. The second impedance section 525 may also provide the delayed signal to the first current sink section 521.

The first impedance section 523 may include a capacitive element 524. The capacitive element 524 may receive the first signal IN at one end. The second impedance section 525 may include a resistive element 526. The resistive element 526 may be electrically coupled between the negative output node OUTB and the other end of the capacitive element 524. The first current sink section 521 may include a transistor 522. The transistor 522 may be the N-channel MOS transistor. The transistor 522 may be electrically coupled to the other end of the capacitive element 524 at its gate, electrically coupled to the negative output node OUTB at its drain, and electrically coupled to the second voltage node at its source. The predetermined amount of time may be determined by the RC delay of the resistive element 525 and the capacitive element 524. The capacitive element 524 may be charged and turn on the transistor 522 when the first signal IN has the high level. The capacitive element 524 may also be discharged and turn off the transistor 522 when the first signal IN has the low level. When the signal outputted from the negative output node OUTB has the high level, the resistive element 526 may delay the high-level signal and may turn on the transistor 522 by providing the delayed signal to the transistor 522. When the signal outputted from the negative output node OUTB has the low level, the resistive element 526 may delay the low-level signal and may turn off the transistor 522 by providing the delayed signal to the transistor 522.

The second active load 530 may include a second current sink section 531 and a third impedance section 532. The second current sink section 531 may form a current path between the positive output node OUT and the second voltage node based on the signal outputted from the positive output node OUT. The third impedance section 532 may delay the signal outputted from the positive output node OUT. The third impedance section 532 may also provide the delayed signal to the second current sink section 531. The third impedance section 532 may include a resistive element and a capacitive element. The third impedance section 532 may also include an element corresponding to the second delay section 232 described with reference to FIG. 2.

The buffer circuit 5 may further include first and second passive loads 551 and 552. The first passive load 551 may include a resistive element. The first passive load 551 may also be electrically coupled between the negative output node OUTB and the first active load 520. The second passive load 552 may include a resistive element. The second passive load 552 may also be electrically coupled between the positive output node OUT and the second active load 530.

Figure 6:
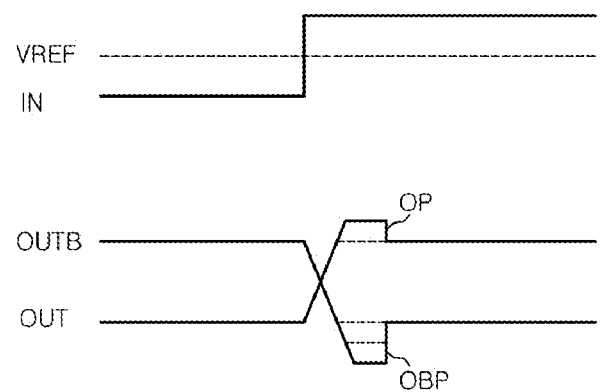
FIG. 6 is a timing diagram illustrating an operation of a buffer circuit shown in FIG. 5.

Referring to FIG. 6, a timing diagram illustrating an operation of the buffer circuit 5 shown in FIG. 5 is illustrated. FIG. 6 illustrates waveforms of the signals, which are outputted from the positive output node OUT and the negative output node OUTB, when the first signal IN transitions from the low level to the high level. When the first signal IN transitions from the low level to the high level, current influx from the first voltage node to the negative output node OUTB may decrease and current influx from the first voltage node to the positive output node OUT may relatively increase. Therefore, the voltage level of the negative output node OUTB may be relatively lower than the voltage level of the positive output node OUT.

As the current influx to the negative output node OUTB decreases, the transistor 522 may be turned off. At this time, the capacitive element 524 may be charged by the high-level first signal IN. The capacitive element 524 may also provide additional current to the gate of the transistor 522. In addition, turn-off time of the transistor 522 may be delayed because transmission of the signal outputted from the negative output node OUTB is delayed by the resistive element 526. Therefore, the transistor 522 may keep the turn-on state for a predetermined amount of time. The transistor 522 may also allow the negative output node OUTB to be further driven to the low level. Accordingly, the peak OBP of the signal outputted from the negative output node OUTB may be greater than the peak of the signal outputted from the negative output node OUTB of the buffer circuit 2 described with reference to FIG. 2. Accordingly, the voltage level difference between the signals outputted from the positive output node OUT and the negative output node OUTB may become greater and thus the buffer circuit 5 may allow the semiconductor apparatus to correctly receive signals.

Figure 7:
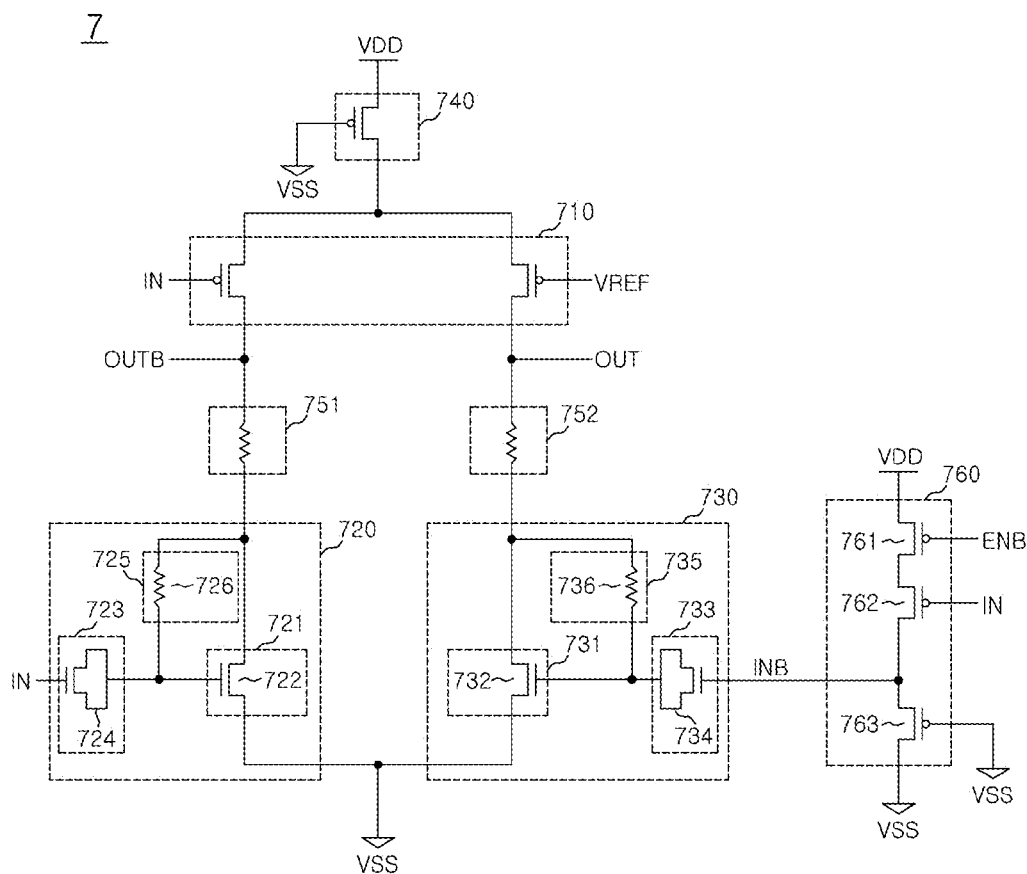
FIG. 7 is a circuit diagram illustrating a buffer circuit in accordance with an embodiment of the invention.

Referring to FIG. 7, a circuit diagram illustrating a buffer circuit 7 in accordance with an embodiment of the invention is described. The buffer circuit 7 may include an amplification unit 710, a first active load 720 and a second active load 730. The buffer circuit 7 may further include an enablement unit 740. The amplification unit 710 and the enablement unit 740 may be the same as the amplification unit 210 and the enablement unit 240 described with reference to FIG. 2, respectively.

The first active load 720 may be electrically coupled between the negative output node OUTB and a second voltage node. The first active load 720 may receive the first signal IN. When a level of a signal outputted from the negative output node OUTB are changing, the first active load 720 may generate a peak of the signal outputted from the negative output node OUTB based on the first signal IN. When the level of the signal outputted from the negative output node OUTB are changing, the first active load 720 may generate the peak of the signal outputted from the negative output node OUTB by allowing the negative output node OUTB to be additionally driven for a predetermined amount of time. Since the first active load 720 forms the peak of the negative output node OUTB based on the first signal IN, the first active load 720 may form the peak in a more effective way.

The second active load 730 may be electrically coupled between the positive output node OUT and a second voltage node. The second active load 730 may receive the inversed signal INB of the first signal IN. When a level of a signal outputted from the positive output node OUT are changing, the second active load 730 may generate a peak of the signal outputted from the positive output node OUT based on the inversed signal INB of the first signal IN. When the level of the signal outputted from the positive output node OUT are changing, the second active load 730 may generate the peak of the signal outputted from the positive output node OUT by allowing the positive output node OUT to be additionally driven for a predetermined amount of time. Since the second active load 730 forms the peak of the positive output node OUT based on the inversed signal INB of the first signal IN, the second active load 730 may form the peak in a more effective way.

The first active load 720 may include a first current sink section 721, a first impedance section 723, and a second impedance section 725. The first current sink section 721 may form a current path between the negative output node OUTB and a second voltage node based on the first signal IN and the signal outputted from the negative output node OUTB. For example, the first current sink section 721 may form the current path when the voltage level of the negative output node OUTB is high. The first current sink section 721 may also block the current path when the voltage level of the negative output node OUTB is low. The first impedance section 723 may control the first current sink section 721 to form or block the current path. The first impedance section 723 may control the first current sink section 721 based on the first signal IN. For example, the first impedance section 723 may control the first current sink section 721 to form the current path when the first signal IN has a high level. In addition, the first impedance section 721 may control the first current sink section 721 to block the current path when the first signal IN has a low level. The second impedance section 725 may receive the signal outputted from the negative output node OUTB. The second impedance section 725 may delay the signal outputted from the negative output node OUTB. Further, the second impedance section 725 may provide the delayed signal to the first current sink section 721.

The first impedance section 723 may include a first capacitive element 724. The first capacitive element 724 may receive the first signal IN at one end. The second impedance section 726 may include a first resistive element 726. The first resistive element 726 may be electrically coupled between the negative output node OUTB and the other end of the first capacitive element 724. The first current sink section 721 may include a first transistor 722. The first transistor 722 may be the N-channel MOS transistor. The first transistor 722 may be electrically coupled to the other end of the first capacitive element 724 at its gate, electrically coupled to the negative output node OUTB at its drain, and electrically coupled to the second voltage node at its source. The predetermined amount of time may be determined by the RC delay of the first resistive element 726 and the first capacitive element 724.

The second active load 730 may include a second current sink section 731, a third impedance section 733, and a fourth impedance section 735. The second current sink section 731 may form a current path between the positive output node OUT and a second voltage node based on the inversed signal INB of the first signal IN and the signal outputted from the positive output node OUT. For example, the second current sink section 731 may form the current path when the voltage level of the positive output node OUT is high. Further, the second current sink section 731 may block the current path when the voltage level of the positive output node OUT is low. The third impedance section 733 may control the second current sink section 731 to form or block the current path. The third impedance section 733 may control the second current sink section 731 based on the inversed signal INB of the first signal IN. For example, the third impedance section 733 may control the second current sink section 731 to form the current path when the inversed signal INB of the first signal IN has a high level. The third impedance section 733 may also control the second current sink section 731 to block the current path when the inversed signal INB of the first signal IN has a low level. The fourth impedance section 735 may receive the signal outputted from the positive output node OUT. The fourth impedance section 735 may delay the signal outputted from the positive output node OUT. In addition, the fourth impedance section 735 may provide the delayed signal to the second current sink section 731.

The third impedance section 733 may include a second capacitive element 734. The second capacitive element 734 may receive the inversed signal INB of the first signal IN at one end. The fourth impedance section 735 may include a second resistive element 736. The second resistive element 736 may be electrically coupled between the positive output node OUT and the other end of the second capacitive element 734. The second current sink section 731 may include a second transistor 732. The second transistor 732 may be the N-channel MOS transistor. The second transistor 732 may be electrically coupled to the other end of the second capacitive element 734 at its gate, electrically coupled to the positive output node OUT at its drain, and electrically coupled to the second voltage node at its source. The predetermined amount of time may be determined by the RC delay of the second resistive element 736 and the second capacitive element 734.

The buffer circuit 7 may further include first and second passive loads 751 and 752. The first passive load 751 may include a resistive element, and may electrically be coupled between the negative output node OUTB and the first active load 720. The second passive load 752 may include a resistive element. The second passive load 752 may also be electrically coupled between the positive output node OUT and the second active load 730.

Figure 8:
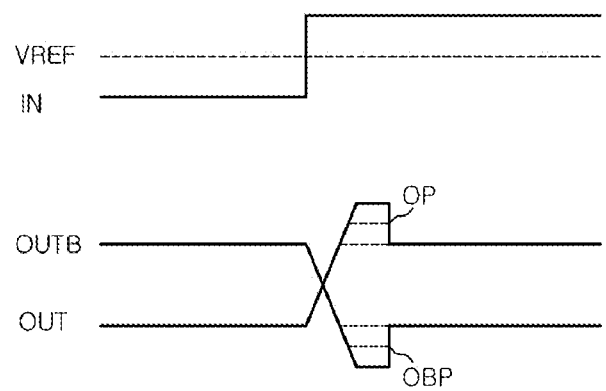
FIG. 8 is a timing diagram illustrating an operation of a buffer circuit shown in FIG. 7.

Referring to FIG. 8, the buffer circuit 7 may further include a control inverter 760. The control inverter 760 may generate the inversed signal INB of the first signal IN based on an enablement signal ENB and the first signal IN. The control inverter 760 may generate the inversed signal INB of the first signal IN according to the level of the first signal IN when the enablement signal ENB is enabled. The control inverter 760 may include third to fifth transistors 761 to 763. The third and fourth transistors 761 and 762 may be the P-channel MOS transistors, and the fifth transistor 763 may be the N-channel MOS transistor. The third transistor 761 may receive the enablement signal ENB at its gate. The third transistor 761 may also be electrically coupled to the first voltage node at its source. The fourth transistor 762 may receive the first signal IN at its gate, may be electrically coupled to the drain of the third transistor 761 at its source, and may output the inversed signal INB of the first signal IN at its drain. The fifth transistor 763 may receive the second voltage at its gate. The fifth transistor 763 may also be electrically coupled to the drain of the fourth transistor 762 at its drain and to the second voltage node at its source.

FIG. 8 is a timing diagram illustrating an operation of the buffer circuit 7 shown in FIG. 7. FIG. 8 illustrates waveforms of the signals, which are outputted from the positive output node OUT and the negative output node OUTB, when the first signal IN transitions from the low level to the high level. When the first signal IN transitions from the low level to the high level, current influx to the negative output node OUTB may decrease and current influx to the positive output node OUT may relatively increase. Therefore, the voltage level of the negative output node OUTB may be relatively lower than the voltage level of the positive output node OUT. As the current influx to the negative output node OUTB decreases, the first transistor 722 may be turned off. At this time, the first capacitive element 724 may receive the first signal IN. The first capacitive element 724 may also provide current to the gate of the first transistor 722. In addition, turn-off time of the first transistor 722 may be delayed because transmission of the signal outputted from the negative output node OUTB is delayed by the resistive element 726. Therefore, the first transistor 722 may keep the turn-on state for a predetermined amount of time. The first transistor 722 may also allow the negative output node OUTB to be further driven to the second voltage during the predetermined amount of time. Accordingly, the peak OBP of the signal outputted from the negative output node OUTB may be formed.

Conversely, as the current influx to the positive output node OUT increases, the second transistor 732 may be turned on. At this time, current influx to the second transistor 732 may be delayed by the second capacitive element 734 and the second resistive element 736 receiving the inversed signal INB of the first signal IN. Further, the second transistor 732 may be turned on after delay with a predetermined amount of time. Therefore, the second transistor 732 may allow the positive output node OUT to be further driven to the first voltage during the predetermined amount of time. When the peaks OP and OPB of the signals outputted from the from the positive output node OUT and the negative output node OUTB, the voltage level difference between the signals outputted from the positive output node OUT and the negative output node OUTB may become greater and thus the buffer circuit 7 may allow the semiconductor apparatus to correctly receive signals.

Figure 9:
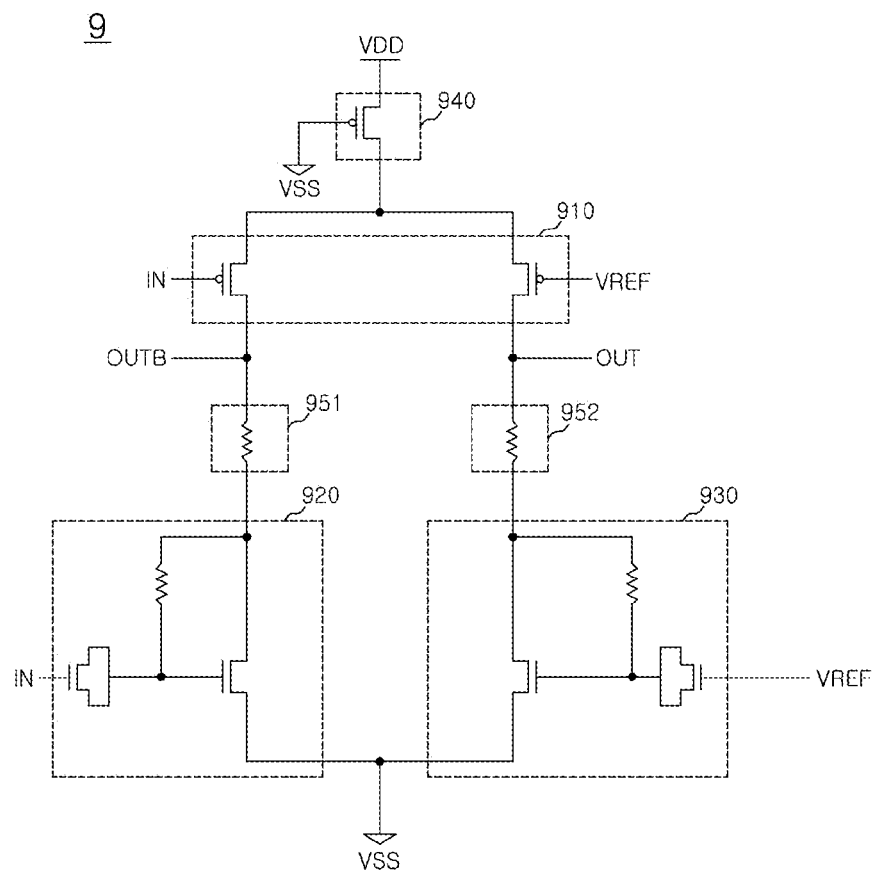
FIG. 9 is a circuit diagram illustrating a buffer circuit in accordance with an embodiment of the invention.

Referring to FIG. 9. a circuit diagram illustrating a buffer circuit 9 in accordance with an embodiment of the invention is described. The buffer circuit 9 may include an amplification unit 910, a first active load 920 and a second active load 930. The buffer circuit 9 may further include an enablement unit 940. The amplification unit 910 and the enablement unit 940 may be the same as the amplification unit 210 and the enablement unit 240 described with reference to FIG. 2, respectively. The first and second active loads 920 and 930 may be the same as the first and second active loads 720 and 730 of the buffer circuit 7 described with reference to FIG. 7. The second active load 930 may receive the second signal VREF while the second active load 730 may receive the inversed signal INB of the first signal IN as described with reference to FIG. 7. The first active load 920 may form a peak of a signal outputted from the negative output node OUTB in response to the first signal IN. Further, the second active load 930 may form a peak of a signal outputted from the positive output node OUT in response to the second signal VREF. The buffer circuit 9 may further include first and second passive loads 951 and 952.

The embodiment of the invention will not be limited to the capacitive elements and resistive elements exemplarily included in the delay sections and the impedance sections disclosed in this document. The elements included in the delay sections and the impedance sections may be replaced with various elements having the same functions or combination thereof.

While certain embodiments have been described above, it will be understood to those skilled in the art that the embodiments described are by way of examples only.

Accordingly, the interface circuit including buffer circuit for high speed communication, semiconductor apparatus and system including the same should not be limited based on the described embodiments. Rather, the interface circuit including buffer circuit for high speed communication, semiconductor apparatus and system including the same described herein should only be limited in light of the claims that follow when taken in conjunction with the above description and accompanying figures.

What is claimed is:

1. A buffer circuit comprising:
   an amplification unit electrically coupled to an output node and configured to sense and amplify first and second signals; and
   an active load unit configured to form a peak value of a signal outputted from the output node when the signal transitions,
   wherein the peak value is different from a steady state of the signal after the signal transitions.

2. The buffer circuit of claim 1, wherein the active load unit allows the output node to be further driven for a predetermined amount of time when a level of the signal outputted from the output node transitions.

3. The buffer circuit of claim 1, wherein the active load unit comprises:
   a first active load electrically coupled between a negative output node and a voltage node; and
   a second active load electrically coupled between a positive output node and the voltage node.

4. The buffer circuit of claim 3, wherein the first active load comprises:
   a first delay section configured to delay a signal outputted from the negative output node; and
   a first current sink section configured to form a current path between the negative output node and the voltage node based on an output of the first delay section.

5. The buffer circuit of claim 4, wherein the second active load comprises:
   a second delay section configured to delay a signal outputted from the positive output node; and
   a second current sink section configured to form a current path between the positive output node and the voltage node based on an output of the second delay section.

6. The buffer circuit of claim 3, wherein the first active load comprises:
   a transistor electrically coupled to the negative output node and the voltage node at its source and drain, respectively;
   a resistive element electrically coupled between the negative output node and a gate of the transistor; and
   a capacitive element electrically coupled between the gate of the transistor and the voltage node.

7. The buffer circuit of claim 3, wherein the second active load comprises:
   a transistor electrically coupled to the positive output node and the voltage node at its source and drain, respectively;
   a resistive element electrically coupled between the positive output node and a gate of the transistor; and
   a capacitive element electrically coupled between the gate of the transistor and the voltage node.

8. A buffer circuit comprising:
   an amplification unit configured to change voltage levels of a positive output node and a negative output node by sensing and amplifying first and second signals;
   a first active load configured to allow the negative output node to be more negatively driven for a predetermined amount of time according to the first signal and a signal outputted from the negative output node when the voltage level of the negative output node transitions; and
   a second active load configured to allow the positive output node to be more positively driven for another predetermined amount of time according to a signal outputted from the positive output node.

9. The buffer circuit of claim 8, further comprising:
   an enablement unit electrically coupled between the positive output node and the negative output node and a first voltage node, and configured to form a current path.

10. The buffer circuit of claim 8, wherein the first active load comprises:
    a first current sink section configured to form a current path based on the first signal and the signal outputted from the negative output node;
    a first impedance section configured to control the first current sink section based on the first signal; and
    a second impedance section configured to delay the signal outputted from the negative output node, and to provide the delayed signal to the first current sink section.

11. The buffer circuit of claim 10, wherein the second active load comprises:
    a second current sink section configured to form a current path based on the signal outputted from the positive output node; and
    a third impedance section configured to delay the signal outputted from the positive output node, and to provide the delayed signal to the second current sink section.

12. The buffer circuit of claim 9, wherein the first active load comprises:
    a capacitive element configured to receive the first signal at one end;
    a resistive element electrically coupled to the other end of the capacitive element and the negative output node; and
    a transistor electrically coupled to the negative output node at its drain, to a second voltage node at its source, and to the other end of the capacitive element at its gate.

13. The buffer circuit of claim 8, wherein the second active load comprises:
    a transistor electrically coupled to the positive output node and a second voltage node at its drain and source, respectively;
    a resistive element electrically coupled between the positive output node and a gate of the transistor; and
    a capacitive element electrically coupled between the gate of the transistor and the voltage node.

14. A buffer circuit comprising:
    an amplification unit configured to change voltage levels of a positive output node and a negative output node by sensing and amplifying first and second signals;
    a first active load configured to allow the negative output node to be more negatively driven for a predetermined amount of time according to the first signal and a signal outputted from the negative output node when the voltage level of the negative output node transitions; and
    a second active load configured to allow the positive output node to be more positively driven for another predetermined amount of time according to an inversed signal of the first signal and a signal outputted from the positive output node when the voltage level of the positive output node transitions.

15. The buffer circuit of claim 14, further comprising:
an enablement unit electrically coupled between the positive output node and the negative output node and a first voltage node, and configured to form a current path.

16. The buffer circuit of claim 14, wherein the first active load comprises:
a first current sink section configured to form a current path based on the first signal and the signal outputted from the negative output node;
a first impedance section configured to control the first current sink section based on the first signal; and
a second impedance section configured to delay the signal outputted from the negative output node, and to provide the delayed signal to the first current sink section.

17. The buffer circuit of claim 16, wherein the second active load comprises:
a second current sink section configured to form a current path based on the inversed signal of the first signal and the signal outputted from the positive output node;
a first impedance section configured to control the second current sink section based on the inversed signal of the first signal; and
a second impedance section configured to delay the signal outputted from the negative output node, and to provide the delayed signal to the second current sink section.

18. The buffer circuit of claim 15, wherein the first active load comprises:
a capacitive element configured to receive the first signal at one end;
a resistive element electrically coupled to the other end of the capacitive element and the negative output node; and
a transistor electrically coupled to the negative output node at its drain, to a second voltage node at its source, and to the other end of the capacitive element at its gate.

19. The buffer circuit of claim 15, wherein the second active load comprises:
a capacitive element configured to receive the inversed signal of the first signal at one end;
a resistive element electrically coupled to the other end of the capacitive element and the positive output node; and
a transistor electrically coupled to the positive output node at its drain, to a second voltage node at its source, and to the other end of the capacitive element at its gate.

20. The buffer circuit of claim 14, further comprising:
a control inverter configured to generate the inversed signal of the first signal from the first signal in response to an enablement signal.

21. The buffer circuit of claim 14, wherein the first active load is configured to generate a peak of the signal outputted from the negative output node when a level of the signal outputted from the negative output node is changing.

22. The buffer circuit of claim 14, wherein the second active load is configured to generate a peak of the signal outputted from the positive output node when a level of the signal outputted from the positive output node is changing.

23. The buffer circuit of claim 16, wherein the first current sink section is configured to form the current path based on the first signal and the signal outputted from the negative output node when the voltage level of the negative output node is high and block the current path based on the first signal and the signal outputted from the negative output node when the voltage level of the negative output node is low.

24. The buffer circuit of claim 17, wherein the second current sink section is configured to form the current path based on the inversed signal of the first signal and the signal outputted from the positive output node when the voltage level of the positive output node is high and block the current path based on the inversed signal of the first signal and the signal outputted from the positive output node when the voltage level of the positive output node is low.

25. The buffer circuit of claim 23, wherein the first impedance section is configured to control the first current sink section to form or to block the current path.

26. The buffer circuit of claim 24, further comprising:
a third impedance section configured to control second current sink section to form or to block the current path.

27. The buffer circuit of claim 26, further comprising:
a fourth impedance section configured to delay the signal outputted from the positive output node and provide the delayed signal to the second current sink section.

* * * * *